United States Patent [19]
Liu et al.

[11] Patent Number: 6,099,701
[45] Date of Patent: Aug. 8, 2000

[54] ALCU ELECTROMIGRATION (EM) RESISTANCE

[75] Inventors: Chung-Shi Liu; Shau-Lin Shue; Chen-Hua Yu, all of Hsin-chu, Taiwan

[73] Assignee: Taiwan Semiconductor Manufacturing Company, Hsin-Chu, Taiwan

[21] Appl. No.: 09/342,034

[22] Filed: Jun. 28, 1999

[51] Int. Cl.[7] .................... C23C 14/34; H01L 21/4763
[52] U.S. Cl. ................ 204/192.22; 204/192.15; 204/192.17; 438/648; 438/656; 438/685; 438/638; 438/622; 438/625; 438/627; 438/637
[58] Field of Search .............. 204/192.15, 192.22, 204/192.17; 438/648, 656, 685, 638, 622, 625, 627, 637

[56] References Cited

U.S. PATENT DOCUMENTS

| | | |
|---|---|---|
| 5,462,895 | 10/1995 | Chen . |
| 5,525,543 | 6/1996 | Chen . |
| 5,604,155 | 2/1997 | Wang . |
| 5,756,396 | 5/1998 | Lee et al. .................... 438/622 |
| 5,759,916 | 6/1998 | Hsu et al. .................... 438/636 |

FOREIGN PATENT DOCUMENTS 6-340970  12/1994  Japan .

*Primary Examiner*—Alan Diamond
*Attorney, Agent, or Firm*—George O. Saile; Stephen B. Ackerman; William J. Stoffel

[57] ABSTRACT

A method of manufacturing a Al-Cu line stack comprised of Ti-rich TiN, TiN, Ti-rich TiN, Al-Cu, Ti-rich TiN, TiN layers. A key feature of the invention is the sputtering of the Ti-rich TiN layers and TiN layers in the same Ti sputter chamber by turning off and on the $N_2$ gas flow. For example, the Ti-rich TiN layer is formed by sputtering Ti with the $N_2$ gas initially turned off. The overlying TiN layer is sputtered with the $N_2$ gas turned on and the process stabilizes. The Ti-rich TiN layer is sputtered during a $N_2$ off step (no $N_2$ gas flow). The invention's Ti-rich TiN, TiN, Ti-rich TiN, Al-Cu, Ti-rich TiN, TiN layers increase the electromigration resistance.

18 Claims, 2 Drawing Sheets

ALCU ELECTROMIGRATION (EM) RESISTANCE

BACKGROUND OF INVENTION

1) Field of the Invention

This invention relates generally to fabrication of metal lines for semiconductor devices and more particularly to the fabrication of a Al-Cu and TiN stack and more particularly to a sputter process to from Ti-rich TiN and TIN and Al layers.

2) Description of the Prior Art

Integrated circuits are formed upon semiconductor substrates within and upon whose surfaces are formed resistors, transistors, diodes and other electrical circuit elements. The electrical circuit elements are connected internally and externally to the substrate and to each other. It is common to use Al lines to interconnect these devices.

A problem with Al lines is electromigration (EM). EM is the transport of metal ions through a conductor and it results from the passage of direct electrical current. The reliability of a metal interconnect is more commonly described by a lifetime experiment on a set of lines to obtain the median time to failure (MFT). The stress experiment involves stressing the lines with high current densities at high temperatures. The failure criterion is typically an electrical open for nonbarrier conductors or about a 20% increase in line resistance for barrier metalization.

There is a challenge to form Al metal lines that have a high EM resistance using simpler processes.

The importance of overcoming the various deficiencies noted above is evidenced by the extensive technological development directed to the subject, as documented by the relevant patents and technical literature. The closest and apparently more relevant technical developments in the patent literature can be gleaned by considering the following: U.S. Pat. No. 5,759,916(Hsu et al.) shows a Ti-rich TiN layer/TIN/AlCu layer. U.S. Pat. No. 5,462,895(Chen) and U.S. Pat. No. 5,525,543(Chen) show Ti-rich TiN/TiN barrier layers formed by CVD. U.S. Pat. No. 5,604,155 (Wang) teaches a Ti/TiN/Ti barrier layer. U.S. Pat. No. 5,756,396 (Lee et al.) shows a TiN barrier layer.

However, better, simpler processes must be developed to form Al metal lines that have higher EM resistance.

SUMMARY OF THE INVENTION

It is an object of the present invention to provide a method for fabricating an Aluminum stack that has improved electromigration resistance.

It is an object of the present invention to provide a method for fabricating a Al-Cu line stack comprised of TiN, Ti-rich TiN, Al-Cu, Ti-rich TiN, and TiN, layers.

It is an object of the present invention to provide a method for fabricating a Al-Cu line stack comprised of Ti-rich TiN, TiN, Ti-rich TiN, Al-Cu, Ti-rich TiN, and TiN, layers.

To accomplish the above objectives, a preferred embodiment of the present invention provides a method of manufacturing a Al-Cu line stack preferably comprised of the following 6 layers: Ti-rich TiN, TiN, Ti-rich TIN, Al-Cu, Ti-rich TiN, TiN layers. A key point of the invention is that Ti-rich TiN layers are adjacent to the Al layer to reduce EM. The Ti-rich TiN layer is formed in a sputter chamber without a nitrogen containing gas flowing (E.g., No $N_2$). The invention's barrier layer is a (1)Ti-rich TiN/(2)TiN/(3)Ti-rich TiN layer used as a barrier layer for Al- alloy lines. The invention teaches a TiN/AlCu/TIN deposition process where at the beginning and end of the TiN depositions $N_2$ is turned off thereby forming a Ti-rich TiN layers on the top and bottom of the TiN layer. The Ti-rich TiN layers improve the resistance to AlCu electromigration.

A key feature of the invention is the sputtering of the Ti-rich TiN layers and TiN layers in the same sputter chamber by turning off and on the $N_2$ gas flow. For example, the Ti-rich TiN layer is formed by sputtering Ti with the $N_2$ gas initially turned off. The overlying TiN layer is sputtered with the $N_2$ gas turned on and the process stabilizes. The Ti-rich TIN layer is sputtered during a $N_2$ off step (no $N_2$ gas flow).

The inventor theorize that the TiN/Al/TiN Stack of the present invention improves the electromigration resistance because Ti-rich TiN layers react with the AlCu to form $TiAl_3$ that improves the EM.

The TiN sputter deposition uses both post $N_2$ turn on and pre-$N_2$ turn off steps to form Ti-rich TiN layers on top and bottom of the TiN layer. The Ti-rich layers are deposited in the same TiN chamber without the need of additional chambers.

The Pre-$N_2$ turn off also increases the adhesion of metal and post oxide CMP surface.

Additional objects and advantages of the invention will be set forth in the description that follows, and in part will be obvious from the description, or may be learned by practice of the invention. The objects and advantages of the invention may be realized and obtained by means of instrumentalities and combinations particularly pointed out in the appended claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

Figure 1:
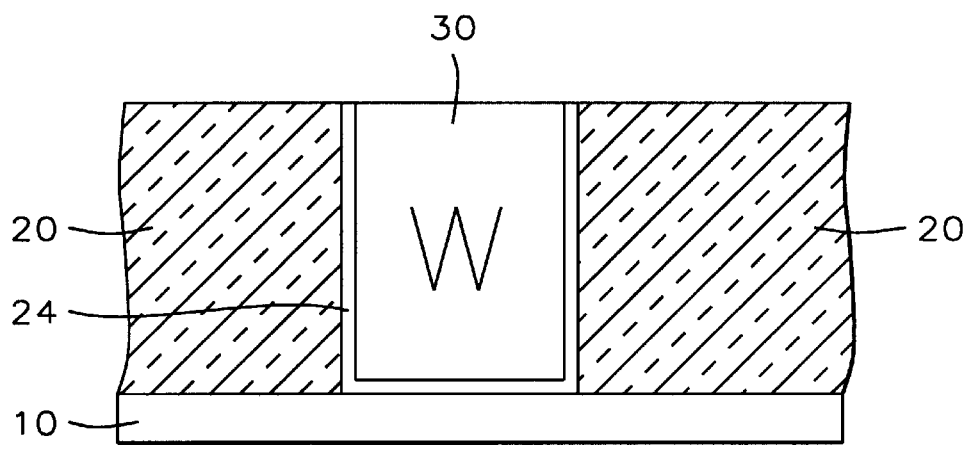
FIGS. 1 and 2 are cross sectional views for illustrating a method for manufacturing a Al stack over a W plug according to the present invention.
Figure 2:
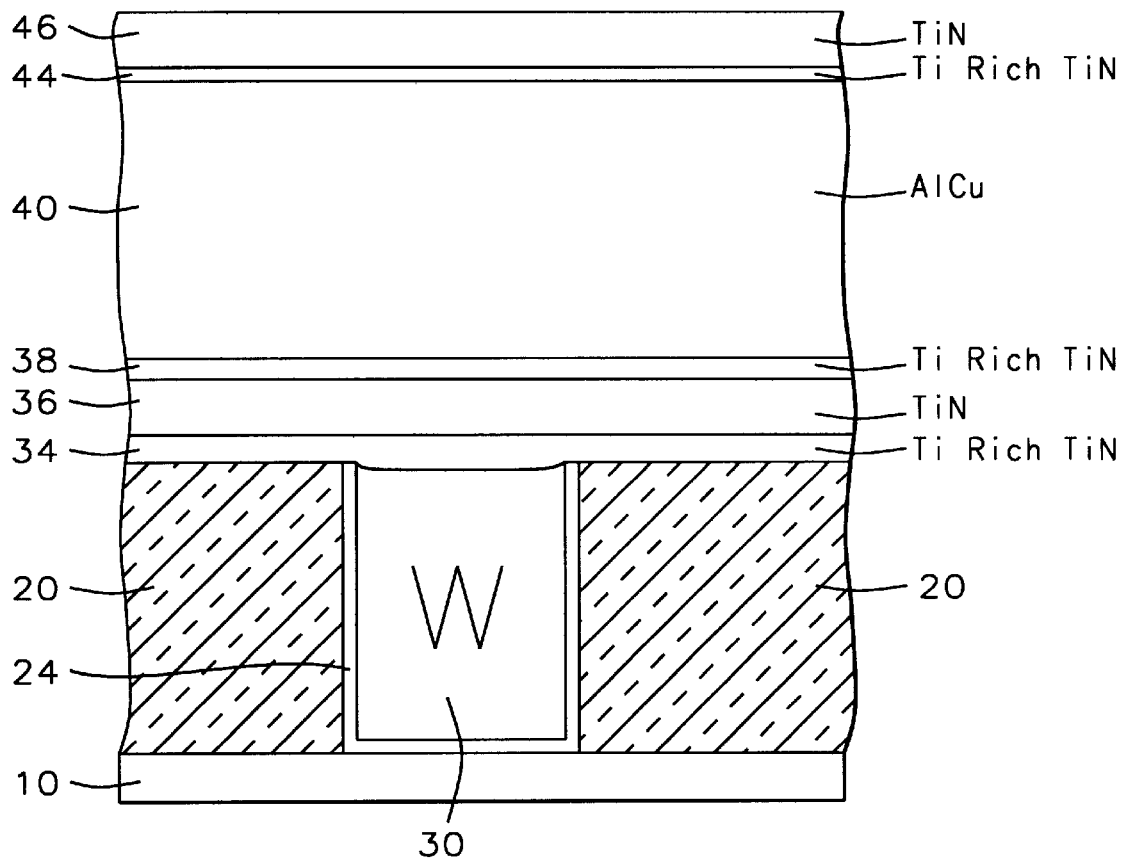

The present invention will be described in detail with reference to the accompanying drawings. The present invention provides a method of forming an Al stack that has a high electromigration resistance.

In the following description numerous specific details are set forth such as flow rates, pressure settings, thicknesses, etc., in order to provide a more thorough understanding of the present invention. It will be obvious, however, to one skilled in the art that the present invention may be practiced without these details. In other instances, well known process have not been described in detail in order to not unnecessarily obscure the present invention. Also, the flow rates in the specification can be scaled up or down keeping the same molar % or ratios to accommodate difference sized reactors/ sputters as is known to those skilled in the art.

A. Overview of Preferred Embodiments of the Invention

The invention is a sputter process that forms Ti-rich TiN layers and TiN layers in the same chamber. The Ti-rich TiN layers increase EM resistance. The table below summaries the major steps and layers of the invention.

TABLE 1

Overview of major steps of the invention

| Sputter chamber | Layer sputtered | step |
|---|---|---|
| - Ti sputter chamber (First TiN film) | bottom Ti-rich TiN layer 34, middle TiN layer 36, top Ti-rich TiN layer 38 | Sputter Ti - Pre-$N_2$ turn off step<br>Sputter Ti - $N_2$ turned on<br>Sputter Ti - Post $N_2$ turn off (no $N_2$ flow) |
| Al sputter chamber - Al Layer 40 | Al Layer 40 | AL sputter |
| Ti sputter chamber - Second TiN film 44 46 | first Ti-rich TiN layer 44<br>second TiN layer 46; | Sputter Ti - Pre-$N_2$ turn off (no $N_2$ flow)<br>Sputter Ti = $N_2$ turned on |

B. Semiconductor Structure 10 and W Plug

A pre-metal dielectric layer (PMD) 20 is formed over a semiconductor structure having devices formed therein and thereon. The semiconductor structure preferably has a top surface comprised of a dielectric layer.

The semiconductor structure 10 is understood to possibly include a semiconductor wafer, active and passive devices formed within the wafer and layers formed on the wafer surface. The term semiconductor structure is meant to include devices formed within a semiconductor wafer and the layers overlying the wafer. The term semiconductor structure surface is meant to include the upper most exposed layers over a semiconductor wafer, such as a silicon surface, an insulating layer or metallurgy lines.

An insulating layer 20 (e.g., a pre-metal dielectric layer 20) is formed over the semiconductor structure 10. The insulating layer is preferably composed of silicon oxide and preferably has a thickness of between about 6000 and 10,000 Å.

A conductive plug 30 is formed in the insulating layer 20. The insulating layer is patterned forming via holes. A barrier layer 24 is formed on the sidewalls and bottom of the via hole. The barrier layer is preferably composed of TiN.

A conductive plug 30 is deposited in the via hole. The conductive plug is preferably composed of W.

Next, the invention's high electromagnetic resistant Stack will be described.

C. Sputtering a First TiN Film 34, 36, 38

Next, the first TiN film 34, 36, 38 is formed.

The process of the invention is preferably performed on a suitable sputter tool such as the AMAT applied materials sputter (PVD cluster tool) model Endura HP PVD by applied materials corp. Other suitable sputters include the Varian M2000/8 cluster PVD system and the Novellus, model PVD sputter system. Other sputter systems can be used.

First, the semiconductor structure 10 is loaded into a first sputtering chamber. A suitable sputter tool is the AMAT, applied materials sputter (PVD cluster tool) model Endura HP PVD by Applied Materials, CA, USA. Other suitable sputters include the Varian M2000/8 cluster PVD system and the Novellus, model PVD sputter system. Ti is used as the Sputtering target.

A first TIN film 34, 36, 38 consisting of three layers is sputtered over the semiconductor structure; said first TiN film composed of (1) a bottom Ti-rich TiN layer 34, (2) a middle TiN layer 36, and (3) a top Ti-rich TiN layer 38. The top and the bottom Ti-rich TiN layers preferably have a titanium: nitrogen molar ratio of between 1.5:1 and 3.0:1. The TiN layers 36 46 preferably have a titanium: nitrogen molar ratio of between 1:1 to 1.2:1. The compositions of the Ti-rich TiN layers can be quantified by a AES (Auger electron spectrometer).

The sputtering of the first TiN film is comprised of 3 steps:

Step 1—sputtering to form the bottom Ti-rich TiN layer 34 comprises flowing no $N_2$ gas;

Step 2—sputtering to form the middle TiN layer 36 comprises flowing $N_2$ gas (preferably at a flow rate between about 50 and 150 sccm);

Step 3—the sputtering of the top Ti-rich TiN layer 38 comprises flowing no $N_2$ gas;

The sputter target is composed of Ti.

TABLE 2

Process for sputter the first TiN film 34, 36, 38

| Step | Layer formed | $N_2$ flow sccm | Ar flow sccm | DC plasma power (W) | pressure | substrate temperature (C°) | Time (seconds) | Other important parameters (thickness etc . . . |
|---|---|---|---|---|---|---|---|---|
| 1 - pre $N_2$ turn on | 34 | 0 | 80 | 6.5 Kw | 4 torr | room temp | 2 sec | thickness - 100 Å |
| 2 | 36 | 100 | 50 | 6.5 kw | 4 torr | room temp | 10 to 30 secs | 200–500 Å |
| 3 post $N_2$ turn off | 38 | 0 | 80 | 6.5 kw | 4 torr | room temp | 2 sec | 100 Å |

The $N_2$ flows are turned off and on abruptly (not ramped gradually). For the Ti-rich TiN ON step, the $N_2$ is turned on, after about 10 seconds to stablize the gas. Then plasma is turned on to deposit TiN. For post $N_2$ off, TiN uses a similar method.

The $N_2$ flow rate is set to achieve the proper Ti:N molar ratio in the TiN layer. The $N_2$ flow rate will vary with the sputter tool used.

Figure 3:
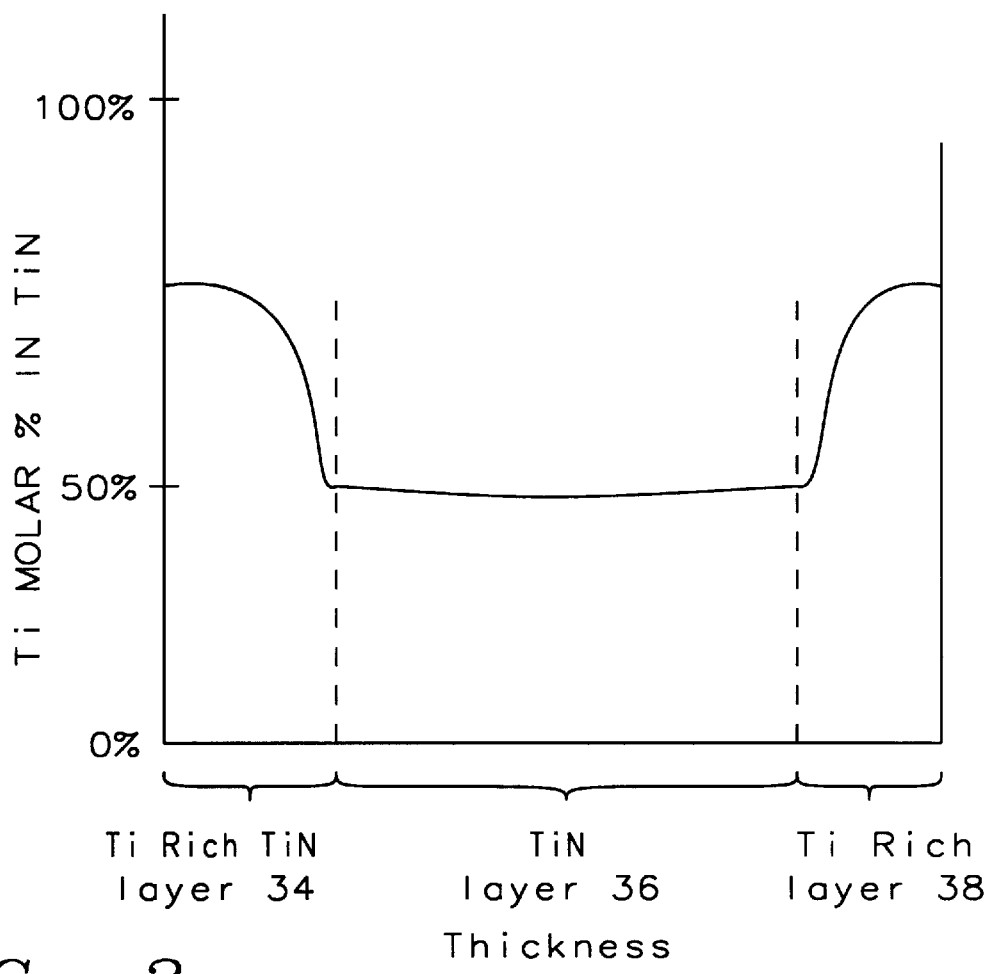
FIG. 3 is a graph showing a Ti Molar concentration profile of a 3 film structure of a Ti-rich TiN/TiN/Ti-rich TiN layers of the present invention.

As shown in FIG. 3, the Ti-rich TiN layers (34 & 38) are not initially pure Ti layers because the Ti target is poisoned by the $N_2$ gas. That is, the Ti target contains some residual $N_2$.

The bottom Ti-rich TiN layer 34 has a thickness of between about 50 and 150 Å. The middle TiN layer 36 has a thickness of between about 200 and 500 Å. The top Ti-rich TiN layer 38 has a thickness of between about 50 and 150 Å.

D. Al Layer 40

Next, the Al-alloy layer 40 (e.g., AlCu) is formed over the first TiN film 34, 36, 38.

The semiconductor structure is loaded into a second sputtering chamber on the sputter tool. The Al layer 40 is sputtered thereover.

The Al alloy line is preferably composed of an aluminum copper alloy or AlSiCu alloy.

The Aluminum alloy line preferably has a thickness of between about 3000 and 10,000 Å. The structure is unloaded from the second sputtering chamber.

E. Sputtering the Second TiN Film 44, 46

Next, we sputter a second TiN film (e.g., 44, 46) preferably consisting of two layers on the Al line 40. The semiconductor structure is loaded into a TiN sputtering chamber (or third chamber), preferably the first chamber used to form the layers 34, 36, 38. The first and third sputter chambers can be the same chamber.

The second TiN film 44, 46 consists of two layers on the Al line 40. The Second TiN film 44, 46 consists of (1) a first Ti-rich TiN layer 44 and (2) a second TiN layer 46. The first Ti-rich TiN layers has a titanium: nitrogen molar ratio of between 1.5:1 to 3:1.

The first Ti-Rich TiN layer 44 preferably has a thickness of between about 50 and 150 Å. The second TiN layer 46 preferably has a thickness of between about 250 and 1000 Å. The sputter process of the TiN film 44 46 preferably comprises 2 steps:

Step 1—the sputtering of the first Ti-rich TiN layer 44 comprises flowing no $N_2$ gas;

Step 2—the sputter of the second TiN layer 46 comprises flowing $N_2$ gas or an N containing gas.

TABLE 3

Process for sputter the AlCu 44, 46

| Step | Layer formed | $N_2$ flow sccm | Ar flow sccm | DC plasma power (W) | Pressure | Substrate temperature (C°) | Time (sec) |
|---|---|---|---|---|---|---|---|
| 1 pre $N_2$ turn on step | 44 | 0 | 50 to 100 | 3 KW to 8 Kw | 1 to 5 torr | 25 to 300 | 2 to 3 sec |
| 2 - $N_2$ turn on step | 46 | 50 to 150 | 20 to 100 | 3 Kw to 8 Kw | 1 to 5 torr | 25 to 300 | 10 to 50 sec |

The $N_2$ flow is set to achieve the desired TiN composition. As described above, the two layers 44, 46 are preferably formed in the in-situ (sequentially in the same sputter chamber).

F. Results—Increase EM

The Al stack of the invention has been tested and found to have superior Electromigration resistance. The Al stack of the present invention increases the Electromigration resistance by 200 to 500% compared to a conventional Al Stack. For the 10 years at 100° C. test, there was one failure among 1000 chips. This is by simulation. The max current is 3.13 MA/$\mu$M for 8 KÅ for electron migration to occur. Larger $J_{max}$ is better.

It should be recognized that many publications describe the details of common techniques used in the fabrication process of integrated circuit components. Those techniques can be generally employed in the fabrication of the structure of the present invention. Moreover, the individual steps of such a process can be performed using commercially available integrated circuit fabrication machines. As specifically necessary to an understanding of the present invention, exemplary technical data are set forth based upon current technology. Future developments in the art may call for appropriate adjustments as would be obvious to one skilled in the art.

While the invention has been particularly shown and described with reference to the preferred embodiments thereof, it will be understood by those skilled in the art that various changes in form and details may be made without departing from the spirit and scope of the invention.

What is claimed is:

1. A method of fabrication of an Aluminum-alloy line having TiN layers that improve the electromigration resistance of said Aluminum-alloy line; comprising the steps of:
   a) loading a semiconductor structure into a first sputtering chamber;
   b) sputtering a first TiN film consisting of three layers over said semiconductor structure; said first TiN film composed of (1) a bottom Ti-rich TiN layer, (2) a middle TiN layer, and (3) a top Ti-rich TiN layer; said top and said bottom Ti-rich TiN layers having a titanium:nitrogen molar ratio of between 1.5:1 to 3:1; wherein sputtering of said first TiN film is comprised of three steps:
   (1) Step 1—sputtering to form said bottom Ti-rich TiN layer comprising not flowing a N-containing gas;
   (2) Step 2—sputtering to form said middle TiN layer comprising flowing N-containing gas at a flow rate; and
   (3) Step 3—sputtering of said top Ti-rich TiN layer comprising not flowing a N-containing gas;
   c) loading said semiconductor structure into a second sputtering chamber; and
   d) forming an Aluminum-alloy line over said first TiN film.

2. The method of claim 1 which further includes:
   e) loading said semiconductor structure into a third sputtering chamber; and
   f) sputtering a second TiN film consisting of two layers on said Aluminum-alloy line; said second TiN film consisting of (1) a first Ti-rich TiN layer and (2) a second TiN layer; wherein said first Ti-rich TiN layer of said second TiN film has a titanium:nitrogen molar ratio of between 1.5:1 to 3:1; and the sputtering of said second TiN film comprises two steps as follows:
  (1) Step A—sputtering of the first Ti-rich TiN layer comprising flowing no N-containing gas; and
  (2) Step B—sputtering of the second TiN layer comprising flowing N-containing gas.

3. The method of claim 1 wherein said bottom Ti-rich TiN layer of said first TiN film has a thickness of between about 50 and 150 Å; said middle TiN layer of said first TiN film has a thickness of between about 200 and 500 Å; and said top Ti-rich TiN layer of said first TiN film has a thickness of between about 50 and 150 Å.

4. The method of claim 1 wherein said Aluminum-alloy line has a thickness of between about 3000 and 10,000 Å.

5. The method of claim 2 wherein the first Ti-rich TiN layer of said second TiN film has a thickness of between about 50 and 150 Å.

6. The method of claim 2 wherein the second TiN layer of said second TiN film has a thickness of between about 200 and 1000 Å.

7. The method of claim 1 wherein said semiconductor structure comprises a pre metal dielectric layer having a W-plug formed therein; and said first TiN film is formed on said W-plug.

8. The method of claim 1 wherein said flow rate is a $N_2$ flow rate between about 50 and 150 sccm.

9. The method of claim 1 where in step (b), substeps (1), (2) and (3), further include sputtering using a Ti target that is poisoned by $N_2$ gas whereby said Ti target contains some residual nitrogen.

10. The method of claim 1 where in step (b), substeps (1), (2) and (3), further include sputtering at a first DC plasma power at a constant wattage.

11. A method of fabrication of an Aluminum-alloy line having TiN layers that improve the electromigration resistance of said Aluminum-alloy line; comprising the steps of:
  a) loading a semiconductor structure into a first sputtering chamber;
  b) sputtering a first TiN film consisting of three layers over said semiconductor structure; said first TiN film composed of (1) a bottom Ti-rich TiN layer, (2) a middle TiN layer, and (3) a top Ti-rich TiN layer; said top and said bottom Ti-rich TiN layers having a titanium: nitrogen molar ratio of between 1.3:1 to 3:1; wherein the sputtering of said first TiN film is comprised of three steps:
    (1) Step 1—sputtering to form said bottom Ti-rich TiN layer comprising flowing no N-containing gas;
    (2) Step 2—sputtering to form said middle TiN layer comprising flowing $N_2$ gas; and
    (3) Step 3—sputtering of said top Ti-rich TiN layer comprising flowing no $N_2$ gas;
  and said bottom Ti-rich TiN layer has a thickness of between about 50 and 150 Å; said middle TiN layer thickness of between about 200 and 500 Å; and said top Ti-rich TiN layer thickness of between about 50 and 150 Å;
  c) loading said semiconductor structure into a second sputtering chamber;
  d) forming an Aluminum-alloy line over said first TiN film; wherein said Aluminum-alloy line has a thickness of between about 3000 and 10,000 Å;
  e) loading said semiconductor structure into a third sputtering chamber; and
  f) sputtering a second TiN film consisting of two layers on said Aluminum-alloy line, said second TiN film consisting of (1) a first Ti-rich TiN layer and (2) a second TiN layer; wherein said first Ti-rich TiN layer of said second TiN film has a titanium:nitrogen molar ratio of between 1.5:1 to 3:1, and the sputtering of said second TiN film comprises two steps as follows:
    (1) Step A—sputtering of the first Ti-rich TiN layer comprising flowing no N-containing gas; and
    (2) Step B—sputtering of the second TiN layer comprising flowing N-containing gas; wherein said first Ti-Rich TiN layer of said second TiN film has a thickness of between about 50 and 150 Å; said second TiN layer of said second TiN film has a thickness of between about 200 and 1000 Å.

12. The method of claim 11 wherein said bottom Ti-rich TiN layer of said first TiN film has a thickness of between about 50 and 150 Å; said middle TiN layer of said first TiN film has a thickness of between about 200 and 500 Å; and said top Ti-rich TiN layer of said first TiN film has a thickness of between about 50 and 150 Å.

13. The method of claim 11 wherein said Aluminum-alloy line has a thickness of between about 3000 and 10,000 Å.

14. The method of claim 11 wherein said first Ti-rich TiN layer of said second TiN film has a thickness of between about 50 and 150 Å.

15. The method of claim 11 wherein said second TiN layer of said second film has a thickness of between about 200 and 1000 Å.

16. The method of claim 11 wherein (2) Step 2—further comprises: sputtering to form said middle TiN layer comprising flowing $N_2$ gas at a flow rate between about 50 and 150 sccm.

17. The method of claim 11 where in step (b), substeps (1), (2) and (3), further include sputtering using a Ti target that is poisoned by $N_2$ gas whereby said Ti target contains some residual nitrogen.

18. A method of fabrication of an Aluminum-alloy line having TiN layers that improve the electromigration resistance of said Aluminum-alloy line; comprising the steps of:
  a) loading a semiconductor structure into a first sputtering chamber;
  b) sputtering a first TiN film consisting of three layers over said semiconductor structure; said first TiN film composed of (1) a bottom Ti-rich TiN layer, (2) a middle TiN layer, and (3) a top Ti-rich TiN layer; said top and said bottom Ti-rich TiN layers having a titanium: nitrogen molar ratio of between 1.3:1 to 3:1; wherein the sputtering of said first TiN film is comprised of three steps:
    (1) Step 1—sputtering to form said bottom Ti-rich TiN layer comprising flowing no N-containing gas;
    (2) Step 2—sputtering to form said middle TiN layer comprising flowing $N_2$ gas; and
    (3) Step 3—sputtering of said top Ti-rich TiN layer comprising flowing no $N_2$ gas; wherein steps 1, 2 and 3 are performed using a first DC plasma power; and wherein the sputtering in steps 1, 2 and 3comprises using a Ti target that is poisoned by $N_2$ gas;
  and said bottom Ti-rich TiN layer has a thickness of between about 50 and 150 Å; said middle TiN layer thickness of between about 200 and 500 Å;
  and said top Ti-rich TiN layer thickness of between about 50 and 150 Å;
  c) loading said semiconductor structure into a second sputtering chamber;
  d) forming an Aluminum-alloy line over said first TiN film; wherein said Aluminum-alloy line has a thickness of between about 3000 and 10,000 Å;

e) loading said semiconductor structure into a third sputtering chamber; and f) sputtering a second TiN film consisting of two layers on said Aluminum-alloy line; said second TiN film consisting of (1) a first Ti-rich TiN layer and (2) a second TiN layer; wherein said first Ti-rich TiN layer of said second TiN film has a titanium:nitrogen molar ratio of between 1.5:1 to 3:1; and the sputtering of said second TiN film comprises two steps as follows:

(1) Step A—sputtering of the first Ti-rich TiN layer comprising flowing no N-containing gas; and (2) Step B—sputtering of the second TiN layer comprising flowing N-containing gas; wherein said first Ti-Rich TiN layer of said second TiN film has a thickness of between about 50 and 150 Å; and said second TiN layer of said second TiN film has a thickness of between about 200 and 1000 Å.

* * * * *